(12) United States Patent
Welser et al.

(10) Patent No.: US 11,889,649 B2
(45) Date of Patent: Jan. 30, 2024

(54) ENERGY STORAGE DEVICE

(71) Applicant: Liebherr-Components Biberach GmbH, Biberach an der Riss (DE)

(72) Inventors: Sven Welser, Äpfingen (DE); Harald Wanner, Attenweiler (DE); Daniel Ried, Schemmerhofen (DE); Michael Schuler, Biberach an der Riss (DE); Markus Eichler, Waldshut (DE); Dietmar Sigg, Riedlingen (DE)

(73) Assignee: Liebherr-Components Biberach GmbH, Biberach an der Riss (DE)

( * ) Notice: Subject to any disclaimer, the term of this patent is extended or adjusted under 35 U.S.C. 154(b) by 571 days.

(21) Appl. No.: 17/122,953

(22) Filed: Dec. 15, 2020

(65) Prior Publication Data

US 2021/0136946 A1    May 6, 2021

Related U.S. Application Data

(63) Continuation of application No. PCT/EP2019/065391, filed on Jun. 12, 2019.

(30) Foreign Application Priority Data

Jun. 15, 2018  (DE) .................... 10 2018 114 462.8

(51) Int. Cl.
*H05K 7/14*    (2006.01)
*H01M 10/627*    (2014.01)
(Continued)

(52) U.S. Cl.
CPC ........ *H05K 7/1432* (2013.01); *H01M 10/425* (2013.01); *H01M 10/627* (2015.04);
(Continued)

(58) Field of Classification Search
CPC .... H05K 7/14; H05K 7/1432; H05K 7/20672; H05K 7/20927; H01M 10/627;
(Continued)

(56) References Cited

U.S. PATENT DOCUMENTS 9,717,164 B2 *  7/2017  Hetzel ................ H05K 7/20672
9,735,724 B2 *  8/2017  Schuster ........... H01M 8/04858
(Continued)

FOREIGN PATENT DOCUMENTS

EP           2693514        2/2014
JP        2012-084486       4/2012
(Continued)

*Primary Examiner* — Amir A Jalali
(74) *Attorney, Agent, or Firm* — Levine Bagade Han LLP

(57) ABSTRACT

The present invention relates to an energy storage device, comprising a switchgear cabinet housing in which a plurality of receiving spaces are provided, in which receiving spaces at least one control device and a variable number of electrical storage blocks are accommodated in an exchangeable manner, wherein the storage blocks can be selectively interconnected in series or in parallel and are connected to power connections by means of a current controller. Therefore, it is initially proposed to form the control device which is installed in the switchgear cabinet housing and the associated power electronics components themselves in a reconfigurable or variable manner in order to allow the controller and power electronics to be matched to another mode of operation or another application, without having to exchange the control and power electronics module and provide corresponding wiring for this purpose.

16 Claims, 7 Drawing Sheets

(51) Int. Cl.
  *H01M 10/6552* (2014.01)
  *H01M 10/42* (2006.01)
  *H01M 50/204* (2021.01)

(52) U.S. Cl.
  CPC ..... *H01M 10/6552* (2015.04); *H01M 50/204* (2021.01); *H01M 2010/4271* (2013.01)

(58) Field of Classification Search
  CPC .......... H01M 10/6552; H01M 10/425; H01M 50/204; H02M 1/00; H02B 1/30; H02B 1/32; H02B 11/02; H02B 13/02; H02P 27/04; H02P 27/06; B60K 6/28
  See application file for complete search history.

(56) References Cited

U.S. PATENT DOCUMENTS

| | | | |
|---|---|---|---|
| 2011/0019327 A1* | 1/2011 | Graf | H02P 1/02 |
| | | | 361/139 |
| 2014/0017528 A1* | 1/2014 | Uehara | H01M 10/482 |
| | | | 429/61 |
| 2015/0343970 A1 | 12/2015 | Choi et al. | |
| 2017/0149355 A1* | 5/2017 | Eichler | H02M 7/487 |
| 2017/0294633 A1 | 10/2017 | Zimbru, Jr. et al. | |
| 2020/0127458 A1* | 4/2020 | Kato | H01M 10/425 |

FOREIGN PATENT DOCUMENTS

| | | |
|---|---|---|
| WO | WO 2018/083332 | 5/2018 |
| WO | WO 2019/238778 | 12/2019 |

\* cited by examiner

ENERGY STORAGE DEVICE

CROSS-REFERENCE TO RELATED APPLICATIONS

This application is a continuation of International Patent Application Number PCT/EP2019/065391 filed Jun. 12, 2019, which claims priority to German Patent Application Number DE 10 2018 114 462.8 filed Jun. 15, 2018, the contents of which are incorporated herein by reference in their entireties.

BACKGROUND

The present invention relates to an energy storage device comprising a switchgear cabinet housing in which a plurality of reception places are provided in which at least one control device and a variable number of electrical storage blocks are accommodated in an exchangeable manner, wherein the storage blocks are selectively interconnected in series or in parallel and are connected to power connections via a current controller.

Such energy storage devices installed in switchgear cabinets are already known from practice and are used for different applications in which switching cabinets are also frequently used for other components of the installation environment. The energy storage devices can in particular be used for electrical drive systems that cyclically require energy in operation and then output it again in generator operation so that it is meaningful to buffer the electrical energy that is output again. Switchgear cabinets are already frequently available for such electrical drive systems, with a system control and control components required for mains operation such as power electronics including frequency converters, fuses, and similar electrical and electronic components being accommodated in said switchgear cabinets. To this extent, it is favorable for the energy storage devices used in a supporting manner to be accommodated in similar switchgear cabinets to, for example, be able to be connected in a simple manner to the higher ranking control or to the power electronics for mains operation in an adjacent switchgear cabinet and to provide easy access to the energy storage device.

To save energy, more and more drives which were previously operated mechanically or hydraulically are being electrified to be able to utilize the better efficiency of electric motors. It is in particular sensible here in applications with cyclically recurring acceleration and deceleration phases and in uphill and downhill drives to integrate an energy storage device in the drive system or to connect it thereto to provide energy in acceleration and uphill phases and to feed released energy back in deceleration and downhill phases and to store it in the at least one storage block, for which purpose capacitors, in particular double layer capacitors, are suitable, but also other battery or rechargeable battery systems. In this respect, depending on the drive system, energy amounts are incurred that are substantial in part and that have to be provided and buffered so that conventional energy stores quickly reach their limits or an intelligent control is required to satisfy the demands.

To adapt the voltage provided by the at least one storage block or the output current to the respective drive system and its voltage and/or current requirements and/or conversely to adapt the current fed back by the drive system to the circumstances of the internal voltage circuit of the storage block, the energy storage device can have at least one rectifier module to adapt the provided or fed current in the required manner with respect to characteristic parameters such as the voltage and/or frequency.

The use of a switchgear cabinet housing having various reception spaces makes it possible here to adapt the respective energy storage device to the respective drive system in a simple manner. Depending on the required power and voltage level, differently configured and different numbers of storage blocks can in particular be accommodated in the switchgear cabinet. While a single storage block can be sufficient in the switchgear cabinet for a smaller drive system, for example, two, three, or also four and five storage blocks can be accommodated in the same switchgear cabinet for a different application. In this respect, different storage block types can be accommodated or replaced with one another for different operating modes. If, for example, large current amounts have to be buffered in the short term, for example due to an uphill and downhill operation taking place in short cycles, capacitor cells, in particular storage blocks having double layer capacitors, can be advantageous. If the energy storage device is, however, used for a more uniform operation in which an additional energy boost or also only an emergency supply is required only at times—for example for startup phases—battery cells can be used as the storage blocks. In yet other applications, fuel cells can also be used as the storage blocks.

Even if the integration of the energy storage device in a switchgear cabinet already enables a certain flexibility and reconfigurability, previous solutions have only had limited flexibility and have not been adaptable to the respective application case to a sufficient degree. In particular on a use for different drive systems that are very far apart from one another with respect to their performance classes, problems arise in known switchgear cabinet solutions with respect to a suitably dimensioned cooling and suitably dimensioned protection with respect to electromagnetic compatibility. If the switchgear cabinet has a cooling system that is sufficiently dimensioned for high performance classes, too great a cooling takes place for applications having only one storage block and a correspondingly small power. At the same time, a high electromagnetic insulation of the switchgear cabinet can waste unnecessary construction space and cause additional weight that is overdimensioned for applications having smaller electromagnetic compatibilities.

On the other hand, known switchgear cabinet solutions, however, still require a relatively high conversion effort to adapt the control and power electronics of the energy storage device to the respective application purpose, even if only limited variations in the power level have to be compensated per se. It is thus, for example, still relatively complex to remove the control module from the switchgear cabinet and to replace it with a different control module that then again has to be wired in a corresponding manner to the storage blocks and to other components. The same applies to the power electronics that are optionally combined with the control device to form a switchgear cabinet module.

It is therefore the underlying object of the present invention to provide an improved energy storage device of the initially named type which avoids disadvantages of the prior art and further develops the latter in an advantageous manner. The energy storage device should in particular be sufficiently flexibly configurable in accordance with the requirements and should be able to be converted quickly without any large effort if the energy storage device is required for another application purpose or also if only a different operating mode of the connected drive device or work device is required.

SUMMARY

Said object is achieved in accordance with the invention by an energy storage device in accordance with claim 1. Preferred embodiments of the invention are the subject of the dependent claims.

It is therefore first proposed to form the control device installed in the switchgear cabinet housing and the power electronic components themselves connected thereto in a reconfigurable or variable manner to enable an adaptation of the control and of the power electronics to a different operating mode or to a different application case without having to replace the control and power electronic module and to effect corresponding wiring for this purpose. In accordance with a first aspect, the energy storage device is characterized in that the at least one current controller via which the power connections of the energy storage device are connected to the at least one storage block is configured as scalable and is operated in different scaling stages in dependence on the number of storage blocks used and on their parallel and/or serial interconnection. A replacement or conversion of the switchgear cabinet module or power electronic module containing the current controller can thereby be avoided. If, for example, the power or voltage level is increased in that an additional storage block is accommodated in the switchgear cabinet and/or if a transition is made from a serial to a parallel interconnection, the current controller can be adapter to the higher power level to be processed by rescaling. The current controller can, for example, have a scalable multiphase design and/or can comprise regulator elements that permit a scalability by a parallel connection.

In an advantageous further development of the invention, said current controller can be a DC/DC regulator or a DC/DC converter via which the at least one storage block provides electrical energy to the power connections of the energy storage device or vice versa energy is charged in the storage block—in generator operation of the connected drive system. A bidirectional DC/DC regulator can in particular be used here via which that at least one storage block can both output energy and can also be charged. Such DC/DC converters or DC/DC regulators designate an electric circuit which can convert a DC voltage supplied at the input into a DC voltage having a higher, lower or inverted voltage level and which is able to transfer energy from the high voltage level into the lower voltage level, for example to charge the energy storage block, and likewise to transfer energy in the other direction, i.e. to withdraw it, or to transfer it from the storage block into the DC voltage circuit of the drive system.

Depending on the storage block and on the drive system, however, other current converters or current controllers such as rectifiers, inverters, frequency converters, or converters in general can be used, with such current converters being able to comprise electronic components such as diodes, transistors or thyristors, but also MOSFETs, IGBTs or IGCTs.

The aforesaid scalability of the at least one current controller can here advantageously take place in a further development of the invention, in an automated or at least semi-automated manner. A detection device can in particular be provided to detect the current power level and/or to detect the number of respectively used storage blocks and/or their parallel or serial connection, with a scaling device being able to scale said current controller in dependence on a signal of said detection device, for example by switching an element or a phase of said current controller on or off.

In order not to be able to use the energy storage device only for DC voltage systems, a frequency converter that can preferably be switched on and off can be provided in addition to the previously named DC/DC controller so that the energy storage device can be used selectively for an AC voltage network with a frequency converter switched on and for a DC voltage network with a frequency converter switched off.

Said frequency converter can be accommodated in the same switchgear cabinet as the storage blocks and the control device or power electronics, but can alternatively also be installed in a separate switchgear cabinet or also be arranged externally at another position.

To be able to adapt the switchgear cabinet to different application purposes and operating modes of the respective connected work machine in a simple manner, the energy storage device can advantageously comprise differently configured storage blocks that are replaceable with one another and that can advantageously be installed in the same reception spaces. This can be achieved, for example, in that the differently configured storage blocks have the same connection dimensions or have connection surfaces that are compatible with one another and by means of which they can be placed into the connection spaces of the switchgear cabinet. If the connection spaces are provided with plug-in guides or slot guides, for example, the storage blocks can have slot guide surfaces matching the guides independently of their type. The storage blocks thus do not have to be identical with one another with respect to their total dimensions and external dimensions—which they naturally nevertheless can be—but it is rather sufficient if the relevant connection dimensions are suitable for the insertion into the respective connection space.

The storage blocks can nevertheless also have mutually different connection dimensions if different reception spaces for them are provided in the switchgear cabinet.

The different storage blocks can in particular comprise at least two of the following three storage block types: a capacitor cell, in particular in the form of a double layer capacitor, a battery cell, and a fuel cell.

Depending on the application case, storage blocks of only one single type can be accommodated in the switchgear cabinet, for example only double layer capacitors or only batteries, with it advantageously being possible to replace the storage blocks with one another in dependence on the application case.

It is, however, alternatively also possible to simultaneously accommodate different storage block types in the same switchgear cabinet, for example at least one double layer capacitor and at least one battery cell. With an arrangement of storage blocks mixed with respect to the storage block type, their advantages can be combined with one another. At least one double layer capacitor can in particular be accommodated in the switchgear cabinet to have a power storage that can quickly take up high electrical energy amounts and output them again and furthermore at least one battery cell can be arranged in the switchgear cabinet as a storage block to cover a basic demand or an emergency demand.

In an advantageous further development of the invention, the energy storage device comprises a cooling device for cooling the storage blocks and optionally also for cooling the control device and/or its power electronics, for example in the form of the previously named DC/DC controller or a different current controller. Said cooling device can advantageously be at least partly integrated into the switchgear cabinet housing, with the cooling device being able to be formed as reconfigurable for uses of the energy storage devices in different power classes and/or different types and numbers of storage blocks or can comprise differently formed cooling modules. Too high a cooling is avoided by such a reconfigurability of the cooling device if the energy storage device works in only low power classes or uses storage blocks that are not temperature critical. A sufficient cooling for more heat intensive applications is simultaneously ensured without having to replace the total switchgear cabinet for this purpose.

Said cooling device can in particular comprise a fluid cooling module that can have coolant lines in the switchgear cabinet housing that can be provided along said reception spaces for the storage blocks and/or for the control device and/or the power electronics, with said coolant lines being able to extend along or also through the reception holders 42 of the reception spaces. If, for example, drawers are provided in the switchgear cabinet housing for the storage blocks, walls that bound the drawer and at which the storage blocks or a control and/or power electronics module is/are inserted can be provided with such coolant lines to withdraw the heat from the storage blocks or from the power electronic module. Alternatively or additionally, however, coolant lines can also be arranged disposed freely in the form of cooling coils and can advantageously be attached directly adjacent to the components of the energy storage device to be cooled.

The coolant that heats up at the warm or hot storage modules is circulated via the coolant lines to a heat exchanger that can advantageously be arranged outside the switchgear cabinet housing—for example at its outer or inner top. Alternatively or additionally, such a heat exchanger can also be accommodated in a separate switchgear cabinet to which the coolant lines are connected.

Alternatively or additionally to such a fluid cooling module, however, an air cooling module can also be provided that can comprise cooling ribs through which cooling air can flow at and/or between the reception spaces. To generate a cooling air flow, at least one cooling air fan can be provided that can blow or suck the cooling air flow through the previously named cooling ribs. Such a cooling air fan can advantageously be provided at every cooling rib group that is provided between reception spaces or storage modules to generate a sufficient cooling air flow and to sufficiently cool every reception space, with the plurality of cooling air fans advantageously being individually switchable to only really cool the required reception spaces in the switchgear cabinet housing. If, for example, one or two reception spaces remain empty because only a small number of storage blocks is required or if individual storage blocks remain switched off for a specific operating mode, the corresponding cooling air fans can likewise be switched off.

Alternatively or additionally to such fluid cooling and/or air cooling modules, however, an at least two-phase cooling module can also be provided that can cool an element of the energy storage device to be cooled by phase conversion of the cooling medium. Such a two-phase cooling module can in particular have at least one coolant container in which a fluid is received that already evaporates at low temperatures so that the fluid can evaporate on an action of heat by the storage blocks or a component of the power electronics or another heat developing component.

Such a coolant container can advantageously be arranged directly at each or at least one of the reception spaces and/or can also be directly associated with one of the storage blocks and/or power electronic modules to be arranged there to effectively cool the respective storage block or the respective power electronic component.

Such a two-phase cooling module can advantageously have a cooling fluid that already evaporates at less than 70° C. or also less than 50° C.

In an advantageous further development of the invention, the cooling device can comprise a pump and tank module in which a storage container for the cooling fluid and a circulating pump can advantageously be combined, with said pump and tank module independently thereof advantageously being able to be adapted to the previously named storage blocks with respect to its dimensions and/or contour and/or connection dimensions such that said pump and tank module can be pushed or inserted into one of the reception spaces of the switchgear cabinet that can serve for the reception of a storage block. To this extent, depending on the configuration and cooling requirement, a storage block or said pump and tank module can be selectively inserted at at least one reception space of the switchgear cabinet. A lowest reception space of the switchgear cabinet can advantageously be provided for receiving the pump and tank module or said pump and tank module can be adapted thereto.

To also be able to easily reconfigure the switchgear cabinet with respect to electromagnetic compatibility, an EMC filter for suppressing electromagnetic interference can be inserted in the switchgear cabinet, preferably in a releasable and exchangeable manner, with such an EMC filter in particular also being able to be inserted in one of the reception spaces of the switchgear cabinet.

Said EMC filter can advantageously be formed with respect to its connection dimensions corresponding to the connection dimensions of a storage block and/or the connection dimensions of the control device and/or the connection dimensions of the power electronic module. If the reception spaces are formed, for example, in the manner of a drawer and/or are provided with a drawer guide, the EMC filter can have drawer guidance surfaces that are compatible with said drawer guides of the reception spaces and optionally correspond to the dimensions of the drawer guidance surfaces of the storage blocks and/or of the control module and/or of the power electronic module so that the EMC filter and said further components such as the storage block, control device, and power electronics can be variably arranged in the switchgear cabinet. The number of EMC filters can optionally also be varied in a simple manner to be able to selectively accommodate one or two or also more EMC filters in the switchgear cabinet without having to convert the switchgear cabinet housing per se for this purpose.

In a further development of the invention, a disconnection device 44 can furthermore be provided in the switchgear cabinet housing for the automatic disconnection of the storage blocks from the current controller in the event of a defect to prevent damage from taking place to the storage blocks on a short circuit of the current controller, for example, or also to prevent the uncontrolled output of energy by the storage blocks from being able to damage components of the drive device connected thereto.

Such a disconnection device 44 can comprise a pyro fuse, for example.

To be able to adapt the energy storage device to different connection cases to an even greater degree and to be able to further scale it with respect to its power level, a plurality of switchgear cabinet housings can also be provided that can each receive a variable number of storage blocks, a control device, and a power electronic module having at least one current controller in said manner in their reception spaces. The plurality of switchgear cabinets can here advantageously be selectively connected to the power connections in parallel with one another or in series with one another and connected to the drive system to be fed and supported in common.

If the energy storage device comprises a plurality of switchgear cabinets in which respective storage blocks, a control device, and power electronics can be accommodated, it can be advantageous if an at least partially centralized cooling device is provided, in particular if the cooling device comprises a fluid cooling module in at least some of the switchgear cabinets. The coolant lines extending through the plurality of switchgear cabinets can in particular be guided to a common heat exchanger and can be connected thereto to centrally recool the coolant. Such a heat exchanger can be accommodated in a further separate switchgear cabinet or externally at another point.

Independently of the provision of only one switchgear cabinet or a plurality of switchgear cabinets, it can be advantageous in a further development of the invention to provide a variably configurable control device in at least one switchgear cabinet to be able to easily adapt the respective control device to different application purposes and/or different operating modes.

The control device itself can in particular have a modular design and can comprise at least one controller board and an adaptation board connectable thereto. Said controller board can here be provided with different control modules to implement different control functions, with the controller board being able to have at least output and/or feed control means to control the current controller for the output and/or feed of current from or into the at least one storage block and voltage regulating means and/or control means for regulating and/or controlling the output voltage of the energy storage device.

Said adaptation board can in particular have a plurality of connection terminals for differently formed external system controls, at least one communication interface for communicating with the controller board, and at least one adaptation circuit to adapt and transmit signals between said connection terminals of the adaptation board and the controller board.

The control device integrated in the energy storage device can be easily connected to differently formed external system controls by the plurality of mutually differently formed connection terminals of the adaptation board.

Depending on how the external system control is configured, the signals, data formats, and/or parameters required or provided by the external system control can be received or transmitted or provided via the respective matching connection terminal of the adaptation board. So that the signals, data, and/or parameters provided by the controller board can also be used by the external system control or, conversely so that signals, data, commands, or parameters provided by the external system control can be used by the controller board, the at least one adaptation circuit of the adaptation board adapts said signals, data, commands, and/or parameter with respect to their format and/or voltage levels and/or with respect to their transmission paths to the respective connection terminal and/or to the communication interface of the adaptation board so that the controller board can communicate with differently configured, higher ranking external system controls.

The adaptation board can advantageously comprise a plurality of adaptation circuits of which one respective matching circuit can adapt the respectively required signals, data, and/or parameters from/to the respective external system control.

In a further development of the invention, said adaptation board can also comprise a plurality of sensor connections for connecting to different sensors that are required for the system control and/or for the internal control device. The adaptation board can in particular be connected by means of said sensor connections on the one hand to sensors internal to the energy storage device by means of which the energy storage device, in particular its storage block and/or at least one operation state is monitored at the current converter and/or at the internal voltage circuit. Alternatively or additionally, the adaptation board can be connected via said sensor connectors to external sensors that at least monitor an operating state of the drive system to be connected or of its power electronics.

Cooling device sensors can, for example, be connected to the sensor connections of the adaptation board for a monitoring of a cooling device, for example a coolant flow amount sensor and/or a coolant mass sensor and/or a temperature sensor, and/or a current and/or voltage sensor for monitoring a current flow and/or a voltage in the voltage circuit of the drive system to be connected and/or in the internal voltage circuit of the storage block and/or a degree of symmetry sensor to monitor the symmetry of a plurality of storage blocks.

Said at least one adaptation circuit of the adaptation board can, for example, comprise one or more hardware components in the form of electronic modules such as semiconductor modules, but also, alternatively or additionally, can comprise one or more software modules that can be stored in a storage module and can be processed in a processor.

The adaptation board can in particular also comprise a plurality of such hardware circuits and/or software modules.

While making use of said adaptation board, a control board adapted to the storage block and its circuit can be used and nevertheless adapted to different higher ranking system controls and can thus be used together. Said adaptation board can be releasably connected to said controller board via one or more plug-in connections. Alternatively or additionally, the adaptation board can, however, also be fixedly wired to the controller board.

Said controller board can advantageously comprise at least one microcontroller, at least one FPGA module, that is a field programmable gate array, furthermore hardware circuits and plug-in connectors for the contacting and/or can consist of said modules. Said hardware circuits of the controller board can here comprise electronic modules such as semiconductor modules, transistors, diodes, or other active or passive elements, with integrated circuits also in particular being able to be provided at the controller board. Alternatively or additionally to said hardware circuits, the control board can, however, also comprise at least one software module that is stored in a storage module and that cooperates with the microcontroller or is worked through by it.

In a further development of the invention, the control device integrated in the energy storage device can furthermore comprise a communication board that is provided to enable a fieldbus communication for the control device, in particular having signal emitting and/having signal processing modules of the energy storage device such as sensors and/or having signal emitting and/or signal processing modules of the drive device to be connected and/or of the external system control such as sensors installed at the drive device.

Said communication board can advantageously have plug-in connectors and can be plugged onto the controller board.

An abundance of control functions can advantageously be implemented and/or preinstalled in said controller board that make it possible for the control device to control the energy storage device for an abundance of different drive devices and different external control systems and to perform corresponding control functions depending on which control function is required by the drive device and/or by the external control system.

The control device of the energy storage device can in particular comprise control means to control the operation of the at least one storage block, with said state control means advantageously being able to be configured for the operation of the energy storage to perform an automatic precharge of an internal circuit and/or an automatic connection and disconnection to and from an external intermediate circuit of the drive system and/or an automatic precharge to a preferably parameterizable initial voltage.

Alternatively or additionally, the integrated control can comprise detection means for detecting different sensors, for example at least one voltage sensor and/or at least one current sensor and/or at least one temperature sensor or at least one flow sensor by means of which corresponding operating parameters of the energy storage device and/or of the drive system can be measured.

Alternatively or additionally, the control device of the energy storage device can comprise power control means for generating control signals for the power electronics of the drive system.

Alternatively or additionally, the control device can comprise a regulator for regulating the current in the storage block.

Alternatively or additionally, the integrated control device can comprise operation control means for setting or controlling different operating modes of the energy storage device, with said operating control means in particular being able to comprise a regulator for regulating an intermediate circuit voltage and/or a regulator for regulating an intermediate circuit voltage with a desired value window and/or a regulator for regulating an intermediate circuit and/or a regulator for regulating a power and/or a regulator for regulating a charge state and/or control means for an active discharge of the storage block.

Alternatively or additionally, the integrated control device can have a self-test module for the self-test of the power electronics.

Alternatively or additionally, the integrated control device can comprise at least one limiter module that is provided and configured to limit or change at least one characteristic adjustment value of the energy storage device and/or of the drive apparatus, for example to limit or lower an output or fed current and/or a voltage level, on a reaching of storage voltage limits and/or on a reaching of storage current limits and/or on a reaching of intermediate power limits and/or on a reaching of temperature limits.

Such a limiter module can advantageously be configured as parameterizable to be able to settably predefine the corresponding voltage limit and/or current limit and/or power limit and/or temperature limit.

Alternatively or additionally, said control device of the energy storage device can comprise at least one monitoring module that is configured to monitor an overcurrent in the energy storage device and/or an overvoltage in an intermediate circuit and/or a voltage in the energy storage device and/or a voltage in the at least one storage block and/or an overtemperature, for example in the cooling water of a cooling device, and/or in the at least one storage block and/or in an inner space of the energy storage device and/or at at least one restrictor and/or in a state of at least one relay and/or a cooling device, for example with respect to coolant flow and/or a cooling system state and/or power electronics and/or a storage state and/or a symmetry function of the storage blocks. Alternatively or additionally, monitoring means can also be provided for monitoring the remaining service life of the energy storage device and/or of the at least one storage block, with such monitoring means being able to calculate and/or estimate said remaining service life.

Alternatively or additionally, the previously named communication board and/or the adaptation board can have a fieldbus communication module for a fieldbus communication with external control systems, with the fieldbus communication module, for example, being able to be provided to predefine an operating mode and/or to predefine a starting or stopping of the drive device and/or to predefine a desired value for a respective operating mode and/or to predefine variable limits during operation and/or a precontrol value for a regulation and/or operating mode and/or to read a current status of the energy store and/or to read and provide current operating data.

Alternatively or additionally, said control device of the energy storage device can comprise a statistics module for determining and/or storing statistical data, for example a time distribution of a storage temperature and/or a time distribution of a power and/or a time distribution of a current in the energy storage device and/or a time distribution of a voltage in the energy storage device.

Alternatively or additionally, the control device can comprise a master/slave control device for operating a plurality of storage blocks in a master/slave mode, with such a master/slave control device advantageously being able to comprise communication means that enable a communication of a plurality of energy storage units among one another, preferably via a CAN bus, and/or synchronization means for synchronizing the voltage of the plurality of energy storage units connected in parallel and/or distribution control means for a uniform distribution of the current in the energy storage units connected in parallel.

Alternatively or additionally, said control device can comprise operating data transmission means for transmitting operating data of the at least one energy storage device to a central server and/or to a cloud.

In an advantageous further development of the invention, the internal control device of the energy storage device, in particular at least one of the aforesaid control means, can be configured as parameterizable to be able to change said functions via a corresponding predefinition of parameters. A parameterization module can advantageously communicate via a USB interface and/or a Profinet interface with an external or internal parameterization device, for example a PC program OPAL, to carry out the desired parameterization.

At least one of the following functions can advantageously be parameterized or adapted by means of said parameterization module.

- at least one communication parameter;
- at least one parameter for the power electronics such as the maximum current, a minimal and/or maximum voltage, at least one sensor, at least one switching time and/or at least one switching frequency;
- at least one operating mode, for example a control mode, via a fieldbus, and/or a master/slave mode and/or an error response mode;
- at least one monitoring function such as the predefining of a limit value for a cooling device and/or a symmetry function and/or a voltage and/or at least one limit value for current and power of the energy storage device and/or of the drive device;

nominal data of the energy storage device such as the nominal capacitance and/or nominal current and/or inductance; and a setting of at least one regulator.

BRIEF DESCRIPTION OF THE DRAWINGS

The invention will be explained in more detail in the following with respect to preferred embodiments and to associated drawings. There are shown in the drawings.

DETAILED DESCRIPTION

Figure 1:
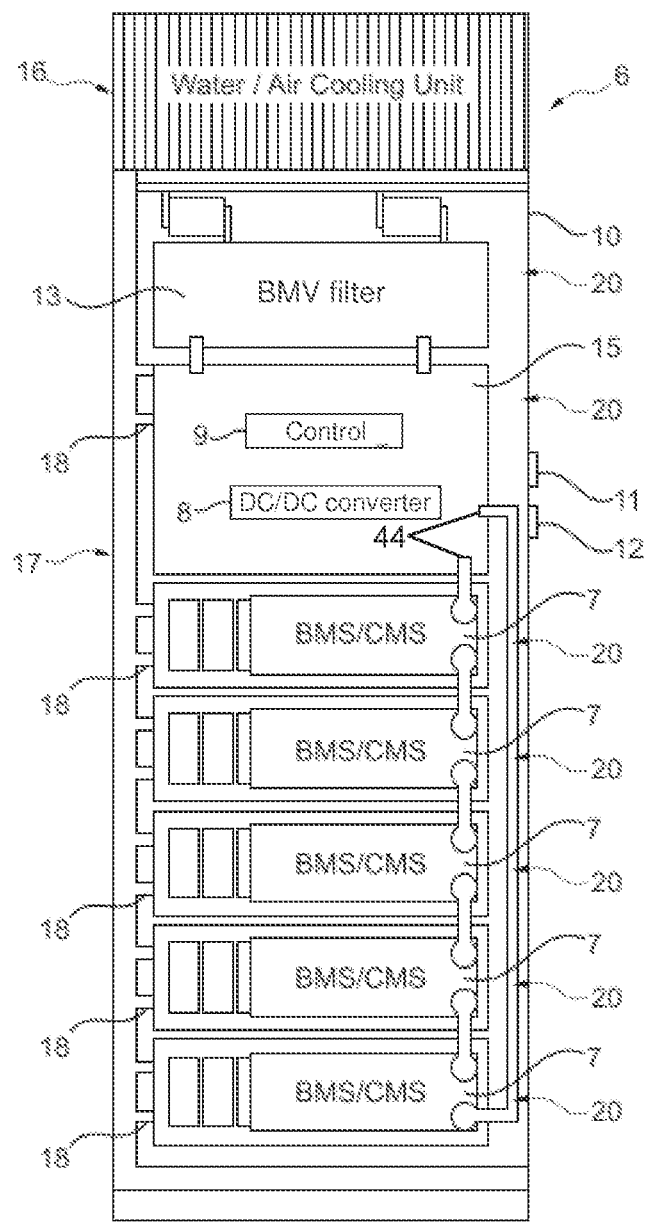
FIG. 1: a schematic representation of an energy storage device having a switchgear cabinet housing in which a plurality of storage blocks, a control electronic and power electronic module, and an EMC filter are accommodated, with a cooling device having a liquid cooling module being provided for cooling the storage blocks and optionally also the power electronic module.

As FIG. 1 shows, the energy storage device 6 comprises a switchgear cabinet housing 10 that can substantially be formed as a cube or as a parallelepiped and that can preferably have a door at its front side that is not shown separately at its front side and that can preferably be pivoted open to have access to the interior of the switchgear cabinet and the components arranged there. Apart from said door, the switchgear cabinet is limited by switchgear cabinet walls including a bottom and a top.

A plurality of reception spaces 20 are provided in the switchgear cabinet housing 10 that can be provided above one another and/or next to one another in the interior of the switchgear cabinet. Said reception spaces 20 can all or group-wise be dimensioned of the same size or also of different sizes.

To be able to insert components into the reception spaces 20 in a simple manner, the reception spaces 20 can each have sliding guides and/or plug-in contours that can be aligned, horizontally for example, approximately in parallel with the depth direction of the switchgear cabinet to enable a simple insertion of the components.

As FIG. 1 shows, a plurality of storage blocks 7 can be received in the switchgear cabinet housing 10 that can be configured, for example, as a capacitor cell, in particular as a double layer capacitor, but also as a battery cell or a fuel cell. In this respect, storage blocks 7 of only one type or also storage blocks of different types, for example a mixture of double layer capacitor blocks and battery blocks, can be arranged in the switchgear cabinet.

In addition to the storage blocks 7, a control electronic and power electronic module 15 is advantageously accommodated in a switchgear cabinet housing 10 that can have an electronic control device 9 that can, for example, comprise a microcontroller, different circuits, a sensor system, and optionally one or more software memory modules.

The control module 15 can furthermore comprise at least one current controller, in particular in the form of a DC/DC controller 8 via which electrical energy can be emitted from the storage blocks 7 to power connections 11, 12 of the energy storage device 6. Said DC/DC controller 8 can advantageously be configured as bidirectional to be able to feed back current fed back via the power connections 11, 12 into the storage blocks 7.

The control device 9 and said current controller can optionally, however, also be accommodated in separate modules that can be inserted into separate reception spaces 20 of the switchgear cabinet housing 10.

In the drawn embodiment of FIG. 1, the storage blocks 7 are connected in series and are connected to the control module 15. Alternatively, the arrangement can, however, also be reconfigured and the power storage blocks 7 can also be connected to the control module 15 connected in parallel.

An EMC filter 13 can furthermore be accommodated in the switchgear cabinet housing 10 to suppress or filter electromagnetic interference. Said EMC filter 13 can advantageously likewise be placed in one of the reception spaces 20 of the switchgear cabinet housing 10 and can be correspondingly configured with respect to its connection dimensions for this purpose.

As FIG. 1 shows, the energy storage device 6 can furthermore comprise a cooling device 16 that can have a liquid cooling module 17 in which a cooling liquid such as water circulates. In this respect, coolant lines 18 can be provided, in particular along the reception spaces 20, for example can also pass through the walls of the reception guide, and/or in the form of cooling coils led along the heat developing storage blocks 7 ad/or at the control and power module 15. Alternatively or additionally, the individual reception spaces 20 can also be provided with coolant line connections to, for example, be able to connect internal coolant lines in the storage blocks, for example, so that the cooling liquid can also flow through the storage blocks and/or through the control electronic and power electronic modules.

The liquid cooling module 17 can furthermore comprise a heat exchanger 19 that can advantageously be arranged outside the switchgear cabinet housing 10, for example positioned on its outer top, to again recool the cooling liquid heated by the storage blocks 7 and/or by the control and power module 15 and to emit the heat to the environment.

Figure 2:
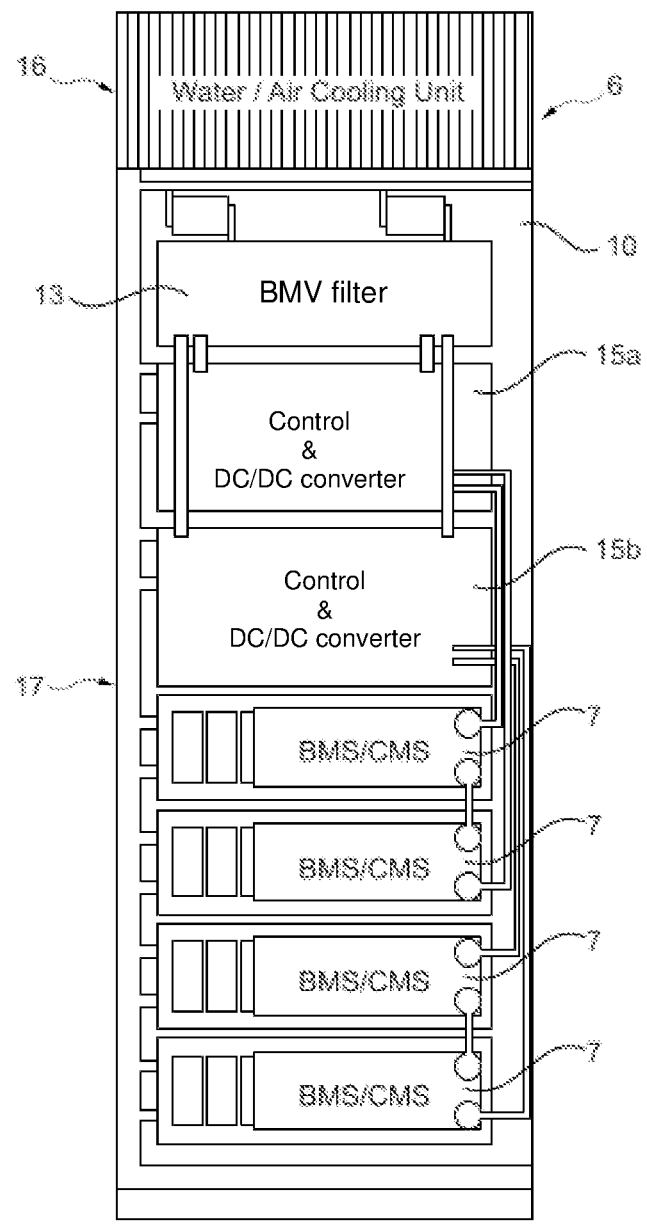
FIG. 2: an energy storage device having a switchgear cabinet housing similar to FIG. 1, with two separate control electronic and power electronic modules being provided and being connected to a respective separate group of storage blocks to be able to be connected to a separate four pole intermediate circuit or a common two pole intermediate circuit.

As FIG. 2 shows, a plurality of control electronic and/or power electronic modules 15a and 15b can also be installed in the switchgear cabinet housing 10, with a subgroup of the storage blocks 7 being connected to the one control electronic and/or power electronic module 15 and another subgroup of the storage blocks 7 being connected to the other control electronic and/or power electronic module 15b. Despite the arrangement in a common switchgear cabinet housing 10, two autonomous storage systems can hereby be provided that can each be connected to a separate four pole or to a common two pole DC voltage intermediate circuit.

Figure 3:
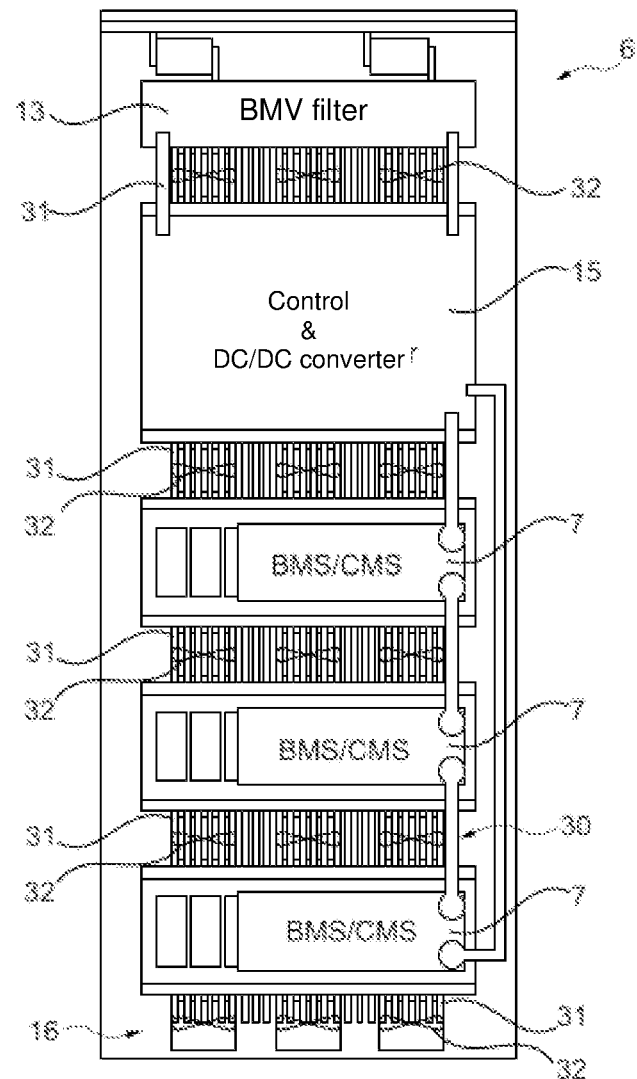
FIG. 3: an energy storage device having a switchgear cabinet housing similar to the preceding Figures, with the cooling device having a cooling air module having cooling ribs between the storage blocks and the control electronic, power electronic, and filter modules with cooling air fans.

As FIG. 3 shows, the cooling device 16 can also have an air cooling module 30 alternatively or in addition to a liquid cooling module to cool the heat developing components of the energy storage device 6 with cooling air. Such an air cooling module 30 can in particular have an arrangement of cooling ribs 31 at or between the reception spaces 20 or at or between the storage blocks 7 and/or at the control electronic and/or power electronic module 15, and optionally also at the EMC filter 13, said arrangement of cooling ribs 31 being able to be connected with material continuity to the walls of the reception spaces, but optionally also directly to the storage blocks 7 and/or to the control electronic and/or power electronic module 15, and optionally to the EMC filter 13, to effectively allow the heat from the components to move into the cooling ribs and to efficiently be output to the cooling air by them due to the large surface of the cooling ribs.

At least one cooling air fan 32 is advantageously provided for the circulation of the cooling air, with at least one separate cooling air fan 32 advantageously being able to be associated with each of the cooling rib arrangements, cf. FIG. 3.

The at least one cooling air fan 32 can advantageously suck in environmental air through inlets at the switchgear cabinet housing 10, for example at the switchgear cabinet door, and can again output the heated air to the environment in an advantageous manner in an upper region of the switchgear cabinet housing 10.

Figure 4:
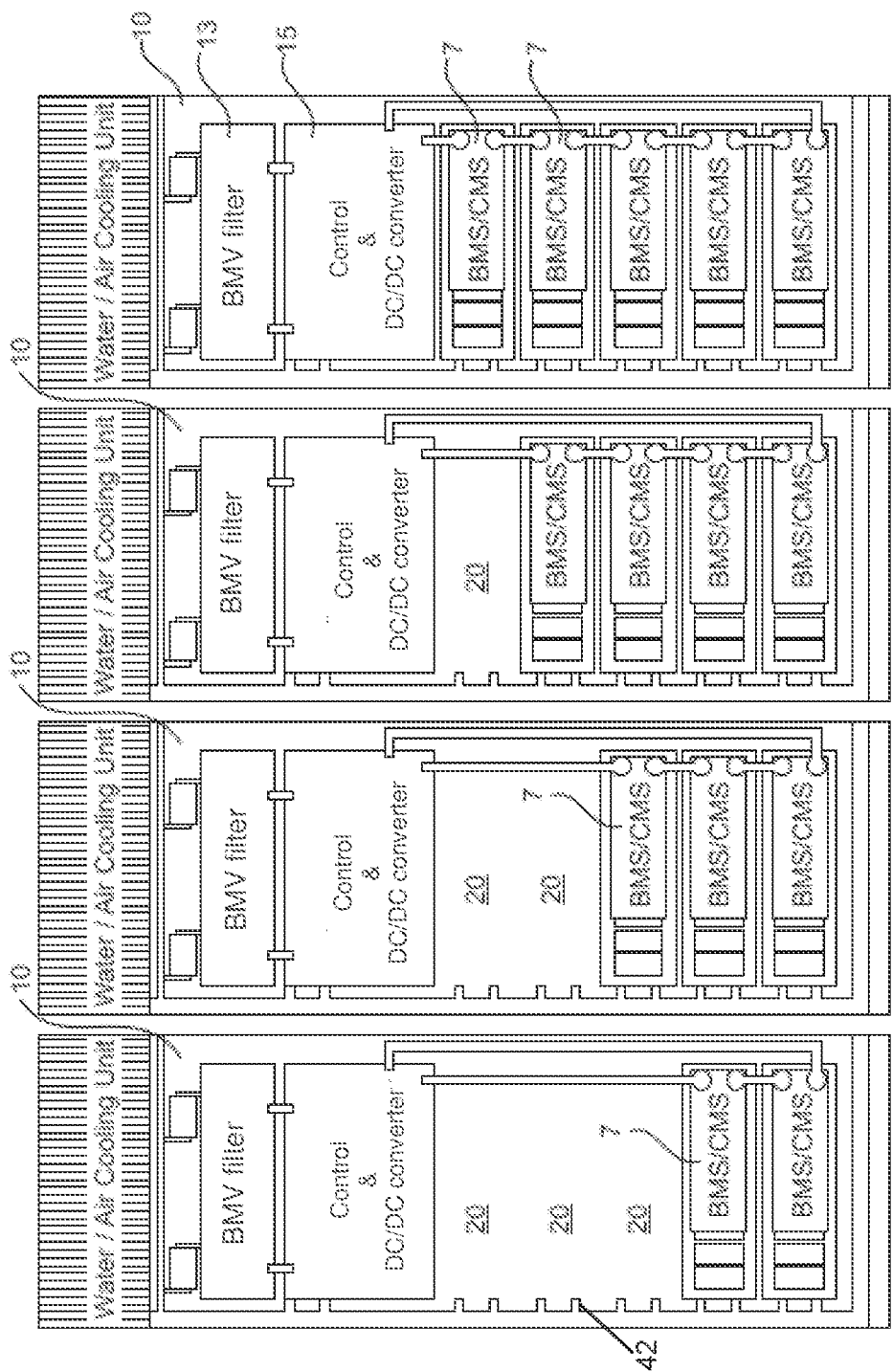
FIG. 4: an arrangement of a plurality of switchgear cabinets that are differently scaled by the arrangement of different numbers of storage blocks in the switchgear cabinet housings.

As FIG. 4 shows, the switchgear cabinets can be scaled as desired in that the number of the storage blocks 7 accommodated in the switchgear cabinet housing 10 is varied, with some reception spaces 20 optionally also being able to remain empty. However, one storage block or a plurality of storage blocks 7 can optionally also be disconnected or not connected, but can otherwise remain in the switchgear cabinet housing 10.

Alternatively or additionally, a scaling of the switchgear cabinets can also be achieved in that individual storage blocks 7 are replaced with storage blocks of higher or lower power to satisfy different power levels.

The DC/DC controller 8 of the control electronic and power electronic module 15 can here advantageously be configured as scalable to be able equally to satisfy the different power configurations.

The power connections of the plurality of switchgear cabinets having the respective storage blocks received therein can be connected in parallel or can also be connected in series to a respective work machine, for example to a drive system, to be able to scale the energy supply device at a larger scale in that the number or type of the storage blocks is not only varied within a switchgear cabinet, but the respective required number of switchgear cabinets is also connected in parallel or in series.

Figure 5:
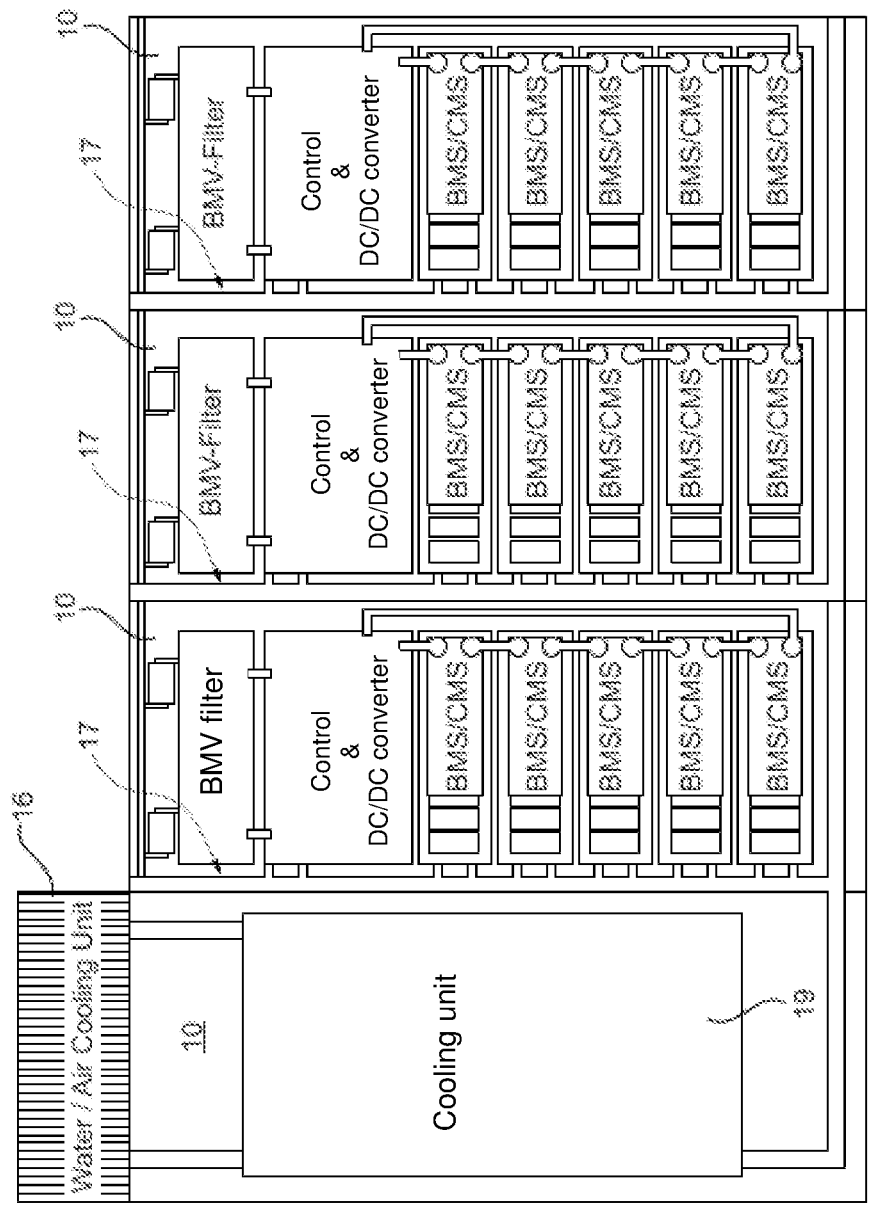
FIG. 5: an arrangement of a plurality of switchgear cabinets each having storage blocks received therein, a control electronic and power electronic module, and a filter module, with liquid cooling modules provide in the switchgear cabinets being connected to a heat exchanger that is accommodated in a further separate switchgear cabinet.

As FIG. 5 shows, if a plurality of switchgear cabinets are used, the liquid cooling modules 17 provided therein can be connected to a common externally arranged cooling unit. A common separate heat exchanger 19 can in particular be provided that can be accommodated in a further separate switchgear cabinet housing and is connected to the cooling lines 18 in the other switchgear cabinet housings 10 to recool the cooling fluid circulating therein. Separate heat exchangers at each of the switchgear cabinet housings 10 can be saved by such a common heat exchanger 19. In this respect, the number of switchgear cabinets whose coolant lines 18 are connected to the common heat exchanger 19, can be varied.

Figure 6:
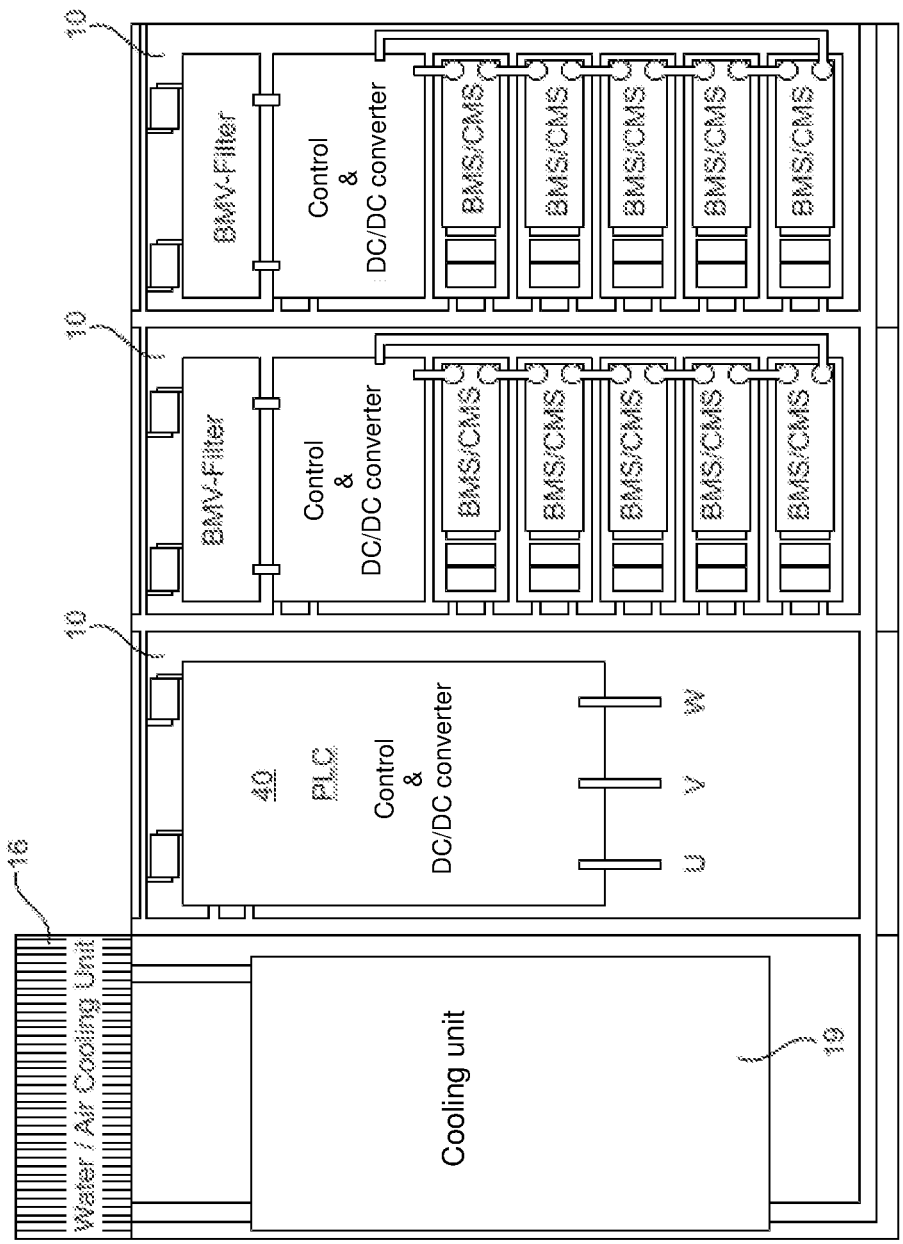
FIG. 6: an arrangement of a plurality of switchgear cabinets similar to FIG. 5, with a plurality of switchgear cabinets each having storage blocks, a control electronic and power electronic module, as well as a filter module, and their liquid cooling modules being connected to a separate, common heat exchanger in a separate switchgear cabinet, with an AC/DC converter additionally being accommodated in a further switchgear cabinet to be able to connect the energy storage device to an alternating voltage network.

As FIG. 6 shows, a further switchgear cabinet housing 10 can also be provided to accommodate a higher ranking control module 40 that can, for example, form a system control for a drive system to be connected or can at least form a part thereof. Alternatively or additionally, an additional power electronic module can also be accommodated in a separate switchgear cabinet housing 10 and can be combined with the previously named control module 40, but can also be formed separately. Such an additional power electronic module can in particular comprise an AD/DC converter and/or a frequency converter to also be able to connect the storage blocks 7 to an AC voltage network or an AC voltage machine.

Figure 7:
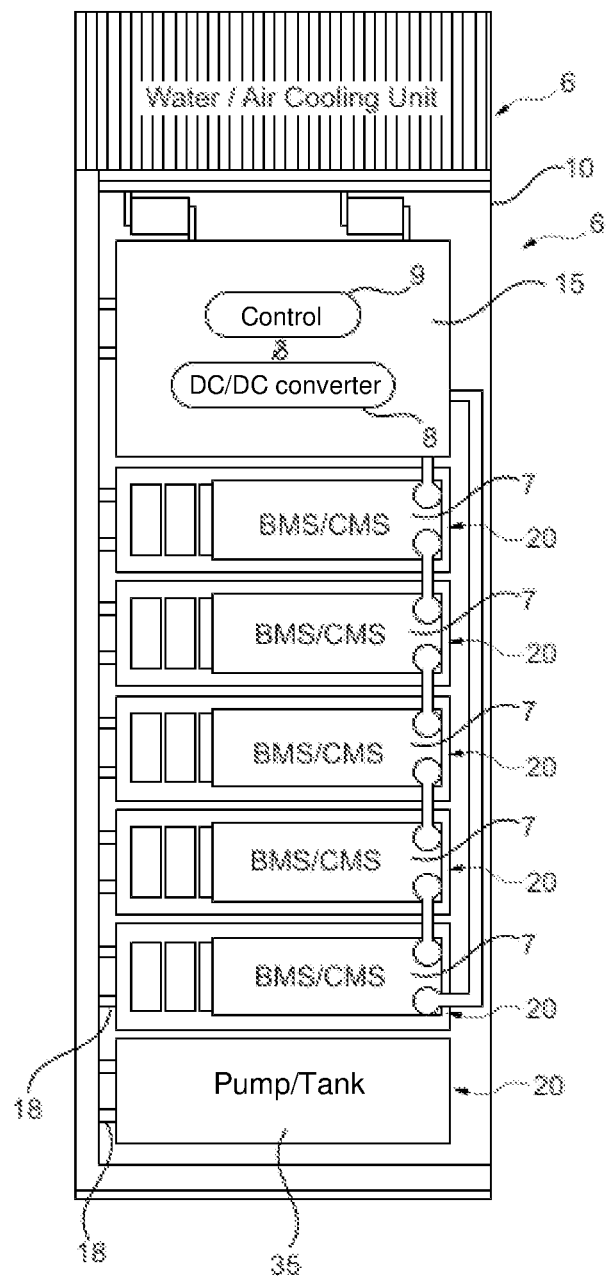
FIG. 7: a schematic representation of an energy storage device similar to FIG. 1 in accordance with a further advantageous embodiment of the invention, with the EMC filter being omitted and a pump module and tank module being inserted in comparison with the embodiment of FIG. 1.

As FIG. 7 shows, the EMC filter 13 can also be omitted or the energy storage device 6 can also be configured or reconfigured such that such an EMC filter 13 is dispensed with in the switchgear cabinet housing 10. This provides additional space in the switchgear cabinet housing 10, for example for a further storage block, and can in particular be a sensible configuration when the electromagnetic compatibility; is less important.

As FIG. 7 furthermore shows, in an advantageous further development of the invention, the cooling device can also comprise a pump and tank unit 35 in whose storage container cooling liquid can be stored and whose pump can serve the circulation of the cooling liquid. Said pump and tank unit 35 can advantageously correspondingly be designed in accordance with one of the storage blocks 7 with respect to its dimensions and connection dimensions and/or can be adapted to one of the reception spaces 20 so that said pump and tank unit 35 can be inserted into one of the reception spaces 20. As previously described for the storage blocks 7, said pump and tank unit 35 can have sliding guide contours and/or plug-in contours to be able to be inserted into corresponding sliding guides and/or plug-in contours of the respective reception space 20.

In a similar manner to the embodiment in accordance with FIG. 7, the EMC filter 13 can also be omitted in the preceding embodiments in accordance with FIGS. 1 to 6 and/or the tank and pump module shown in FIG. 7 can be correspondingly accommodated in one of the other embodiments in the switchgear cabinet housing 10.

We claim:

1. An energy storage device comprising: a switching cabinet housing having reception spaces, wherein the reception spaces are configured to replaceably receive at least one control device and a variable number of storage blocks, wherein the storage blocks are selectively interconnected in series or in parallel and are connected to power connections via a current controller, wherein the current controller is configured to be scalable and operated in different scaling stages in dependence on the number of storage blocks and on the parallel and/or serial connection of the storage blocks, a detection device for the detection of the number of storage blocks used and/or of their parallel and/or serial connection, and a scaling device configured to automatically scale the current controller in dependence on a signal of the detection device.

2. The device of claim 1, wherein the current controller comprises at least one DC/DC controller, and further comprising a frequency converter that can be switched on and off, and/or an AC/DC converter that can be switched on and off configured so the energy storage device can selectively be used with a switched-on frequency converter and/or AC/DC converter for AC voltage systems and with a switched-off frequency converter and/or AC/DC converter for DC current systems.

3. The device of claim 1, wherein differently configured storage blocks are receivable and mutually exchangeable in the reception spaces of the switchgear cabinet housing, with the storage blocks comprising at least two of the following storage block types: a capacitor cell, a battery cell, and a fuel cell.

4. The device of claim 3, wherein a storage block having a double layer capacitor and a storage block having a battery cell are simultaneously in the switchgear cabinet housing.

5. The device of claim 1, further comprising a cooling device for cooling the storage blocks and/or the control device and/or the current controller, and wherein the cooling device is at least partly in the switchgear cabinet housing, wherein the cooling device comprises reconfigurable cooling modules for different performance configurations of the storage blocks and/or for different storage blocks.

6. The device of claim 5, wherein the cooling device comprises at least one liquid cooling module comprising coolants in the switchgear cabinet housing that extend along the reception spaces and/or through reception holders for holding the storage blocks.

7. The device of claim 5, wherein the cooling device comprises at least one air cooling module having cooling ribs and at least one cooling air fan for generating a cooling air flow through the cooling ribs at and/or between the reception spaces and/or at the storage blocks.

8. The device of claim 5, wherein the cooling device comprises at least one two-phase cooling module that has a coolant container at at least one of the reception spaces and/or at least one of the storage blocks, and wherein the coolant container is filled with liquid that evaporates at low temperatures.

9. The device of claim 8, wherein the cooling liquid has a boiling point of less than 70° C.

10. The device of claim 8, wherein the cooling liquid has a boiling point of less than 50° C.

11. The device of claim 8, wherein the cooling liquid has a boiling point of less than 35° C.

12. The device of claim 5, wherein the cooling device comprises a pump and/or tank unit shaped and sized to be inserted into a reception space in the switchgear cabinet housing provided for a storage block.

13. The device of claim 1, further comprising at least one EMC filter in one of the reception spaces in the switchgear cabinet housing, wherein the EMC filter is configured to suppress or reduce electromagnetic interference.

14. The device of claim 1, further comprising a disconnection device in the switchgear cabinet housing for the automatic disconnection of the storage blocks from the current controller in an error case.

15. The device of claim 1, further comprising a plurality of switchgear cabinet housings that each comprise storage blocks received in the reception spaces, wherein the plurality of switchgear cabinet housings being selectively connected in parallel or series to the power connections of the storage blocks received therein.

16. The device of claim 15, wherein at least two of the plurality of switchgear cabinet housings each comprise a liquid cooling module and are connected to coolant lines at a common heat exchanger that is in a further separate switchgear cabinet.

* * * * *